(12) United States Patent  (10) Patent No.: US 7,262,128 B2
Yudasaka et al.                (45) Date of Patent:    Aug. 28, 2007

(54) METHOD OF FORMING MULTILAYER INTERCONNECTION STRUCTURE, AND MANUFACTURING METHOD FOR MULTILAYER WIRING BOARDS

(75) Inventors: Ichio Yudasaka, Chino (JP); Mitsuru Sato, Chino (JP)

(73) Assignee: Seiko Epson Corporation, Tokyo (JP)

( * ) Notice: Subject to any disclaimer, the term of this patent is extended or adjusted under 35 U.S.C. 154(b) by 300 days.

(21) Appl. No.: 10/875,590

(22) Filed: Jun. 25, 2004

(65) Prior Publication Data

US 2005/0026419 A1   Feb. 3, 2005

(30) Foreign Application Priority Data

Jul. 30, 2003   (JP) .............. 2003-282579

(51) Int. Cl.
*H01L 21/4763*   (2006.01)

(52) U.S. Cl. .................... 438/637; 257/774

(58) Field of Classification Search ........ 438/618, 438/622, 637, 672, 675; 257/758, 774, E23.145, 257/E21.575, E21.577, E21.627, E21.641
See application file for complete search history.

(56) References Cited

U.S. PATENT DOCUMENTS 5,846,876 A * 12/1998 Bandyopadhyay et al. . 438/622
6,133,139 A * 10/2000 Dalal et al. ............. 438/624

FOREIGN PATENT DOCUMENTS

| JP | A-60-250650 | 12/1985 |
| JP | A 04-290249 | 10/1992 |
| JP | A 07-122637 | 5/1995 |
| JP | A 07-122638 | 5/1995 |
| JP | A-09-069563 | 3/1997 |
| JP | B2 2625268 | 4/1997 |
| JP | A 10-116905 | 5/1998 |
| JP | A 2000-269336 | 9/2000 |
| KR | 1997-0072086 | 11/1997 |

* cited by examiner

*Primary Examiner*—David Vu
(74) *Attorney, Agent, or Firm*—Oliff & Berridge PLC

(57) ABSTRACT

Method of forming a multilayer interconnection structure that includes a contact hole for reliably connecting between layers, without damaging a substrate. A column shaped mask material is formed in a position for forming a contact hole using a resist, and an interlayer insulating film is applied to the whole surface of the substrate excluding the mask material. Then, the mask material is removed by a method such as peeling. As a result, a hole generated thereby is used as a contact hole.

9 Claims, 8 Drawing Sheets

METHOD OF FORMING MULTILAYER INTERCONNECTION STRUCTURE, AND MANUFACTURING METHOD FOR MULTILAYER WIRING BOARDS

PRIORITY CLAIM

Priority is claimed on Japanese Patent Application No. 2003-282579, filed Jul. 30, 2003, the content of which is incorporated herein by reference.

BACKGROUND OF THE INVENTION

1. Field of the Invention

The present invention relates to a method of forming a multilayer interconnection structure, and a manufacturing method for multilayer wiring boards, and more specifically, relates to a contact hole formation technique for connecting between wiring layers.

2. Description of the Related Art

Recently, in electronic devices such as semiconductor devices and electro-optic devices, wiring is formed in multi layers in order to increase the degree of integration. In devices having such a multi-layer wiring structure, a contact hole (opening) is formed in an interlayer insulating film, in order to secure conduction between wiring layers laminated via the interlayer insulating film.

For example, in a field of electro-optic devices, one in which TFTs for pixel switching, data lines, and pixel electrodes are formed in multi layers has been developed (see Japanese Patent No. 2625268). In devices having such a structure, for example, TFTs are arranged on the bottom layer of the substrate, and data lines are arranged thereon via the first interlayer insulating film. The second interlayer insulating film is provided on the substrate so as to cover the data lines and the first interlayer insulating film, and pixel electrodes are arranged thereon. In order to secure conduction between these layers, the source region of the TFT is connected to the data line via a first contact hole penetrating the gate insulator and the first interlayer insulating film, and the drain region is connected to the pixel electrode via a second contact hole penetrating the gate insulator, the first interlayer insulating film and the second interlayer insulating film.

Conventionally, dry etching has been used for the step of forming such an opening.

However, when the contact hole is formed by etching, the obtained devices may have a difference in electric characteristics according to ununiformity in film thickness of the interlayer insulating film in which the contact hole is formed. For example, since over etching occurs in a portion where the film thickness is thin, the shape of the contact hole may be enlarged, or the wiring layer on the lower layer side may be made thin. Particularly in the case of dry etching, since the etching selection ratio between the insulating material and the conductive material cannot be sufficiently ensured, the degree of thinning of the film increases. Such thinning of the wiring layer on the lower layer side causes an increase in contact resistance or non-ohmic conduction characteristics, and sometimes causes insufficient conduction. The enlarged shape of the contact hole due to over etching causes an increase in leak current between adjacent conductive layers or a short circuit failure. The problem of leak current or short circuit becomes serious as the density of the wiring layer increases and the gaps between the adjacent wiring layers becomes narrower.

Moreover, in a portion where the film thickness is thick, the interlayer insulating film remains at the bottom of the contact hole due to insufficient etching, thereby causing insufficient conduction. In the step of etching described above, plasma etching is often performed, but in this case, plasma damage may occur in the substrate, thereby deteriorating the electric characteristics of the device. Furthermore, since a reaction product is generated in the plasma etching, the product adheres to the bottom and the side wall of the contact hole, thereby causing insufficient conduction.

In a device having the multilayer structure described above, as the gap between the wiring layers to be connected in the vertical direction increases (that is, the number of interlayer insulating films arranged between the layers increases, or the film thickness increases), the aspect ratio of the contact holes arranged between these increases, and hence it becomes difficult to form the opening with one step. Conventionally, therefore, a method has been employed where a relay electrode is provided between these wiring layers, so as to connect between the wiring layer on the lower layer side and the relay electrode, and between the relay electrode and the wiring layer on the upper layer side with separate contact holes (see Japanese Patent No. 2625268). However, with this method, since the relay electrode is formed, the degree of integration decreases, thereby preventing high performance of the device.

SUMMARY OF THE INVENTION

The present invention addresses the above problems, with an object of providing a method of forming a multilayer interconnection structure which ensures conduction between layers without impairing the performance of the devices, and a manufacturing method for multilayer wiring boards using the same.

In order to achieve the above object, the present invention provides a method of forming a multilayer interconnection structure. The method includes the steps of: forming a first wiring layer on a substrate; forming an insulating film having an opening in a predetermined position on the first wiring layer; and forming a second wiring layer which conducts via said opening on the insulating film. The insulating film forming step contains the steps of: forming a mask material in said predetermined position on the first wiring layer; forming an insulating film on the whole surface of the substrate, excluding the mask material; and forming an opening in said insulating film by removing said mask material.

That is, in the present method, a column shaped mask material is previously formed on the first wiring layer before the interlayer insulating film is formed, and is then removed using a stripper or the like after the interlayer insulating film is formed. The hole generated by this is used as a contact hole. Therefore, the substrate is not damaged, which is different from the conventional method using dry etching. Particularly, in the present method, even if the gap between the layers to be connected increases, this can be dealt with by simply changing the height of the mask material (film thickness). Therefore the inconvenience such as where the substrate is largely damaged due to the longer etching time as in the conventional method does not arise. Moreover, in the removing method of the mask material, a method for not etching the first wiring layer at all may be selected, so that sufficient time can be used for removing the mask material. Therefore, the mask material can be reliably removed, and at the same time the situation where the shape of the contact hole is impaired or the first wiring layer is made thin does not occur.

In the case where a plurality of insulating film layers are arranged between the first and second wiring layers, in the insulating film forming step, an opening which penetrates the plurality of insulating film layers in the thickness direction, may be formed by repeating the mask material forming step, insulating film forming step, and mask material removing step.

Therefore, even if the gap between the wiring layers increases, they can be reliably connected without damaging the substrate.

Incidentally, in the aforementioned method, one or a plurality of insulating film layers arranged between the first and the second wiring layers are both opened by forming/removing the mask material. However, in the case where the gap between the layers to be connected is small, for example in the case where an insulating film arranged between the layers is only one layer, then even in the method using the conventional etching, the damage to the substrate or the characteristic deterioration of the device may be accepted in some cases. Moreover, when the insulating film is formed, the existence of the mask material may become a problem for controlling the film quality of the insulating film and the interface state of the insulating film and the lower layered film. In such case, it is desirable to form an opening after the insulating film is formed. That is, in the case where a plurality of interlayer insulating film layers are arranged between the first and the second wiring layers, the object of the present invention can be sufficiently achieved by opening one or a plurality of interlayer insulating film layers (first insulating film) close to the first wiring layer by an etching method or the like, and opening the other interlayer insulating film (second insulating film) by forming/removing the mask material described above. Therefore, in the present invention, a multilayer interconnection structure may be formed by the following method.

That is, the present invention provides a method of forming a multilayer interconnection structure. The method includes the steps of: forming a first wiring layer on a substrate; forming an insulating film having an opening in a predetermined position on the first wiring layer; and forming a second wiring layer which conducts via said opening on the insulating film. The insulating film forming step contains the steps of: forming a first insulating film having an opening in said predetermined position on said first wiring layer; forming a mask material covering the inside of said opening and protruding on said first insulating film in said predetermined position on the substrate; forming a second insulating film on the whole surface of the substrate, excluding the mask material; and forming an opening penetrating said second insulating film in the thickness direction and communicating with the opening in said first insulating film, by removing said mask material.

In this way, the degree of freedom of the process can be increased by dividing the insulating film arranged between layers into the first and the second insulating films and by independently selecting the opening method of these insulating films.

An example of a specific embodiment of the first insulating film forming step includes the first insulating film forming step having: a step of forming a mask material on the first wiring layer; a step of forming an insulating film on the whole surface of the substrate, excluding the mask material; and a step of forming an opening in the insulating film, by removing the mask material.

Moreover, in this method, in the case where the second insulating film includes a plurality of insulating film layers (that is, in the case where a plurality of insulating film layers are arranged between the first insulating film and second wiring layer), in the insulating film forming step, an opening communicating with the plurality of insulating film layers arranged between the first and second wiring layers may be formed by repeating the mask material forming step, second insulating film forming step, and mask material removing step, after the first insulating film forming step. Therefore, even if the gap between the wiring layers increases, they can be reliably connected while sufficiently suppressing damage to the substrate.

The mask material forming method described above may be any method as long as it enables forming a column shaped structure on the substrate. Either inorganic or organic material may be used for the mask material. Moreover a mixed material of these may be used. However, it is more preferable if the mask material is made of organic material, since it is easily formed by using an application method. Specifically, in the mask material forming step, a photosensitive resin is formed on the whole surface of the substrate, and a pattern of the mask material is formed in a position scheduled for forming the opening, by exposing and developing the photosensitive resin, so that the column shaped structure described above can be obtained most easily. In the case where the mask material is made of photosensitive resin in this way, it is easily removed by using a stripper or the like without damaging the substrate. As a result, the present invention is demonstrated more effectively.

If the mask material is made of organic material, it is also possible to form the mask material by a droplet discharge method using a quantitative discharge device such as a printer head of an inkjet printer for example. That is, in the mask material forming step, liquid material is selectively discharged in a position scheduled for forming the opening, and solidified in order to form the mask material. In the droplet discharge method, the material can be supplied only to the necessary part so that the material is more efficiently used compared with the other application methods. As a result, it is more advantageous in cost performance.

For the method of forming the mask material by application, besides these methods, well-known methods such as spin coating, dip coating, roll coating, curtain coating, spray coating, or the like can be used. Since these methods have respective merits and demerits, it is desirable to properly use them according to the shape of the contact hole (opening) to be formed. For example, in spin coating, the film thickness is highly uniform and the film thickness is controlled comparatively easily, however a disadvantage is the point that the material is less efficiently used. On the other hand, in the droplet discharge method, although the material is efficiently used, it is difficult to form a column shaped structure having a high aspect ratio. Therefore, in the mask material forming method, it is preferable to select a mask material forming method according to the number of interlayer insulating film layers where the contact hole penetrates. For example, if the number of layers is one, the droplet discharge method may be used. If there are a plurality of layers, a thick filmed photosensitive resin may be formed on the whole surface of the substrate using spin coating or the like, and a pattern formed by exposing and developing the photosensitive resin.

A manufacturing method for multilayer wiring boards of the present invention is characterized in that the multilayer wiring is formed on a substrate using the methods described above. As a result, highly reliable multilayer wiring boards can be manufactured.

DETAILED DESCRIPTION OF THE INVENTION (First Embodiment)

First is a description of a manufacturing method for multilayer wiring boards according to a first embodiment of the present invention, with reference to FIG. 1A to FIG. 2D. FIG. 1A to FIG. 2D show examples where the present invention is applied to a step of laminating three wiring layers on a substrate. In all drawings hereunder, the film thicknesses and dimensional proportions of the respective components are appropriately changed for clarity.

Figure 1A:
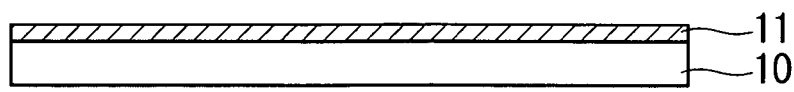
FIGS. 1A to 1D are process drawings for explaining a method of forming a multilayer interconnection structure according to a first embodiment of the present invention.

In the present embodiment, firstly as shown in FIG. 1A, a wiring layer 11 is formed on the surface of a substrate 10 such as a semiconductor substrate on which an insulating film is formed, or an insulating substrate made of glass or plastic, using a well-known method.

Figure 1B:
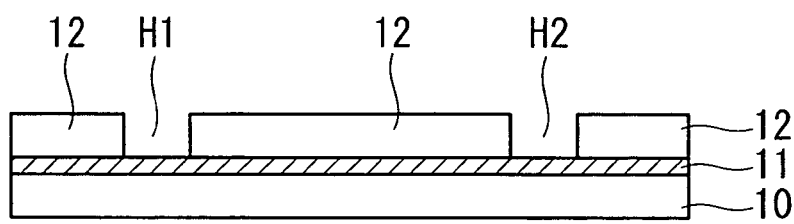

Next, as shown in FIG. 1B, an interlayer insulating film 12 having openings H1 and H2 is formed in a predetermined position on the wiring layer 11. The interlayer insulating film 12 can be formed by a plasma CVD method using TEOS (tetraethoxysilane), oxygen gas, or the like as the raw material. Alternatively, it can also be formed by applying a liquid insulating material such as a SOG (spin on glass) on the whole surface of the substrate and then baking the liquid insulating material. Well-known methods such as spin coating, dip coating, roll coating, curtain coating, spray coating, droplet discharge method (inkjet method) or the like can be used as the method of applying the liquid insulating material. Particularly, in spin coating, since the liquid material is spread out by centrifugal force, an interlayer insulating film with a highly uniform film thickness and a flat surface is formed. Moreover, polysilazane, polyimide, low-K material can be used for the liquid insulating material, besides the SOG described above.

Then, a resist is applied on the interlayer insulating film 12 formed in this way, and an opening is formed in a region where the opening is to be formed (position scheduled for forming the opening) by patterning. Then, the structure in FIG. 1B can be obtained by etching the resist as a mask, and removing the interlayer insulating film positioned in the opening of the resist.

Figure 1C:
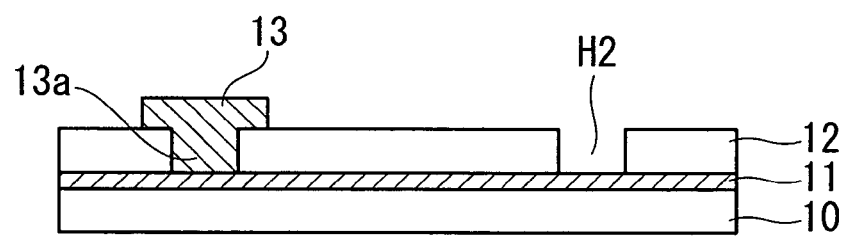

Next, as shown in FIG. 1C, a wiring layer 13 communicating with the wiring layer 11 is formed over the interlayer insulating film 12 via the opening H1. In this step, firstly, using a quantitative discharge device such as a printer head of an inkjet printer, liquid contact forming material containing organometallic compounds as a main material or liquid contact material in which metal microparticles are dispersed, is supplied in the opening H1, and this contact forming material is baked and solidified, so that a connection plug 13a is formed in the opening H1. At this time, in order to reliably fill the liquid material inside of the opening H1, it is desirable to previously perform a lyophilic treatment inside of the opening before applying the liquid material. The lyophilic treatment can be performed by irradiating ultraviolet rays inside the opening, for example.

Next, a liquid-repelling film is formed to cover the interlayer insulating film 12. Then, ultraviolet rays are irradiated onto the substrate via the mask so that the liquid-repelling film arranged on a position scheduled for forming the wiring layer 13 is decomposed and removed. As a result, two kind of regions with and without the liquid-repelling film are formed on the substrate. The region with the liquid-repelling film is liquid-repellent, and the region without the liquid-repelling film is lyophilic. That is, a liquid-repelling region and a lyophilic region are formed on the substrate, and the lyophilic region becomes a wiring forming region. Then a liquid wiring material containing organometallic compounds as a main material or liquid wiring material in which metal microparticles are dispersed is supplied to the wiring forming region and heat treated in order to form the wiring layer 13. After that, the rest of the liquid-repelling film 13 is decomposed and removed by irradiating ultraviolet rays on the whole substrate.

The connection plug may be formed at the same time as the wiring layer 13. In this case, at the step of FIG. 1B, the liquid-repelling film is formed, and the liquid-repelling film arranged in the opening H1 and the position scheduled for forming the wiring layer 13 is decomposed and removed by mask exposure. Then the liquid wiring material is supplied to the region without the liquid-repelling film formed in this way and to the inside of the opening H1, so that the connection plug 13a can be formed at the same time as the wiring layer 13.

Figure 1D:
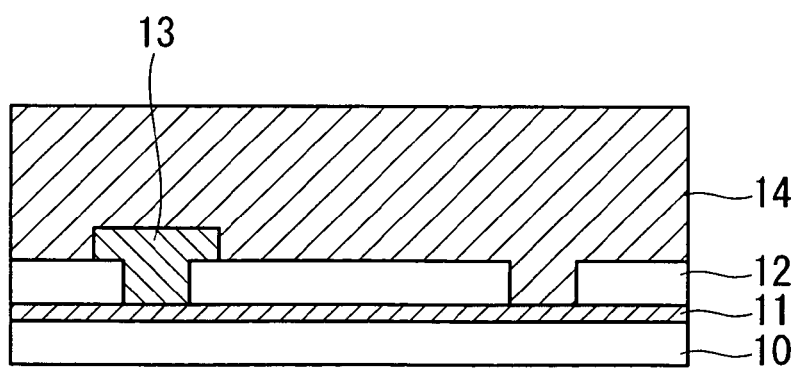

Next, as shown in FIG. 1D, using spin coating or the like, a resist 14, that is, the photosensitive resin, is formed on the whole substrate to cover the wiring layer 13 and the interlayer insulating film 12. At this time, the film thickness of the resist 14 arranged over the interlayer insulating film 12 is assumed to be the same as, or more than that of an interlayer insulating film 15 described later. As a result, a mask pillar 14a described later can be prevented from being buried into the interlayer insulating film 15.

Figure 2A:
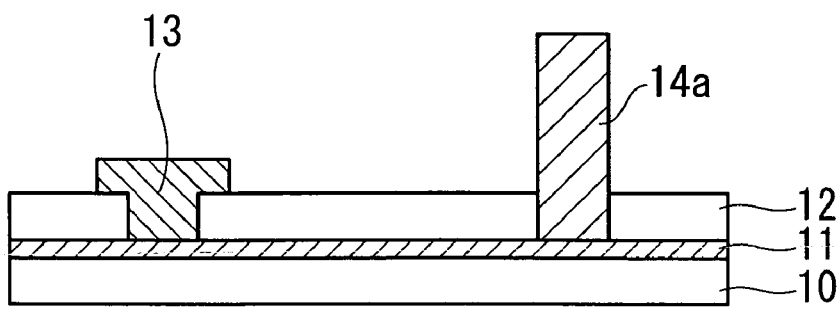
FIGS. 2A to 2D are process drawings following from FIGS. 1A to 1D.

Next, as shown in FIG. 2A, the resist 14 is exposed and developed in order to leave the resist only in the forming position of the opening H2. As a result, a column shaped mask pillar (mask material) 14a which covers the inside of the opening H2 and is extruded over the interlayer insulating film 12 is formed on the substrate.

Figure 2B:
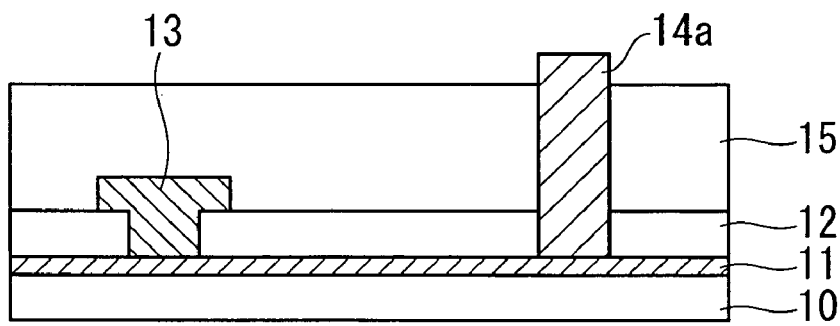

Next, as shown in FIG. 2B, an interlayer insulating film 15 made of oxide silicon or the like is formed in the surroundings of the mask pillar 14a, that is, the whole surface of the substrate excluding the mask pillar 14a. Similarly to the interlayer insulating film 12, the interlayer insulating film 15 can be formed by applying liquid insulating material using a method such as spin coating and by heat treating the liquid insulating material. At this time, in order to prevent the liquid insulating material from adhering to the top of the mask pillar 14a, it is desirable to previously perform a liquid-repelling treatment on the mask pillar 14a before applying the liquid insulating material. The liquid-repelling treatment of the mask pillar 14a can be performed by decomposing a gas containing fluorine such as carbon tetrafluoride by an atmospheric pressure plasma in order to generate active fluorine monoatoms or ions, and exposing the mask pillar 14a to the activated fluorine. If the mask pillar 14a is formed by a liquid-repelling photoresist containing fluorine, such liquid-repelling treatment is unnecessary.

Figure 2C:
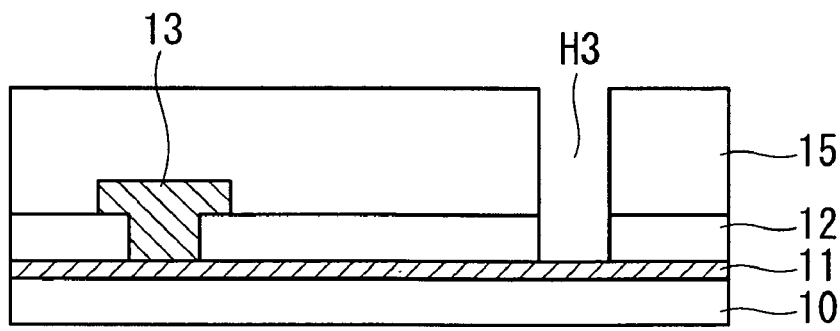

Next, as shown in FIG. 2C, the mask pillar 14a is removed using a stripper or the like. As a result, an opening H3 leading to the wiring layer 11 is formed in the forming position of the opening H2 in the interlayer insulating films 12 and 15.

Figure 2D:
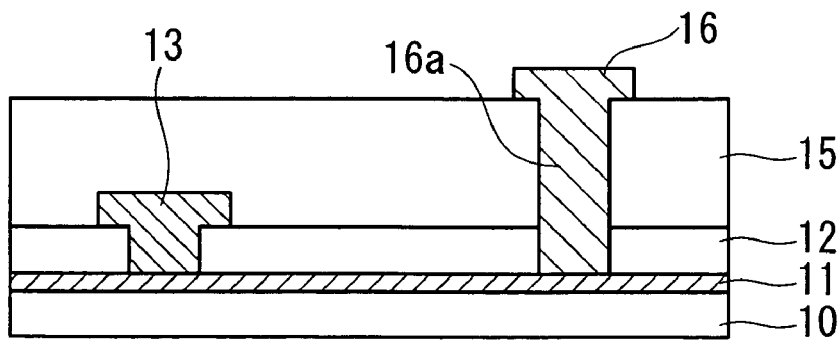

Next, as shown in FIG. 2D, a wiring layer 16 communicating with the wiring layer 11 is formed over the interlayer insulating film 15 via the opening H3. In this step, similarly to the forming step of the wiring layer 13 described above, firstly, using a quantitative discharge device, liquid contact forming material containing organometallic compounds as a main material is supplied in the opening H3, and this liquid contact forming material is baked and solidified, so that a connection plug 16a is formed in the opening H3. At this time, in order to reliably fill the liquid material inside of the opening H3, it is desirable to previously make the inside of the opening lyophilic using a method such as ultraviolet irradiation.

Next, a liquid-repelling film is formed to cover the interlayer insulating film 15, and a pattern of the liquid-repelling film is formed by mask exposure in order to form a wiring forming region. Then a liquid wiring material containing organometallic compounds as a main material is supplied to the wiring forming region and heat treated in order to form the wiring layer 16. After that, the rest of the liquid-repelling film is decomposed and removed by irradiating ultraviolet rays on the whole substrate. The connection plug 16a may be formed at the same time as the wiring layer 16.

In the present embodiment, in this way, a mask pillar formed before forming an interlayer insulating film is peeled off after forming the interlayer insulating film so that a hole generated thereby is used as a contact hole. Therefore, the substrate is not damaged, which is different from the conventional method of opening the interlayer insulating film by dry etching after forming the interlayer insulating film. Particularly, in the present method, even if the gap between the layers to be connected increases, it can be dealt with by simply changing the height of the mask material (film thickness). Therefore the inconvenience such as where the substrate is largely damaged due to the longer etching time as in the conventional method does not arise.

In the present embodiment, an example was shown where the opening H1 is formed by etching; however it is also possible to form this by forming/removing the mask material, similarly to the opening H3. However, in the case where the gap between the layers is small (that is, the number of the interlayer insulating film layers arranged between the layers is small), then even if the contact hole between them is formed by dry etching, the substrate is less damaged due to the shorter etching time and the smaller over etching amount. Therefore, even if an interlayer insulating film layer close to the wiring layer 11 is opened by etching, and the other interlayer insulating film is opened by forming/removing the mask material similarly to the present invention, the principal object of the present invention, that is, the object of increasing the connection reliability of wiring, can be sufficiently achieved. Moreover, when the interlayer insulating film is formed, the existence of the mask material may become a problem for controlling the film quality of the interlayer insulating film, and the interface state of the interlayer insulating film and the lower layered film. In such case, it is desirable to form the opening after the interlayer insulating film is formed.

(Second Embodiment)

Next is a description of a method of forming a multilayer interconnection structure according to a second embodiment of the present invention, with reference to FIG. 3A to FIG. 5B. FIG. 3A to FIG. 5B show examples where the present invention is applied to a step of laminating three wiring layers on a substrate. In the present embodiment, the description is related to a method of forming a multilayer interconnection structure where a first layer and a third layer become conductive, the first layer and a second layer become conductive, and the second layer and the third layer become conductive.

Figure 3A:
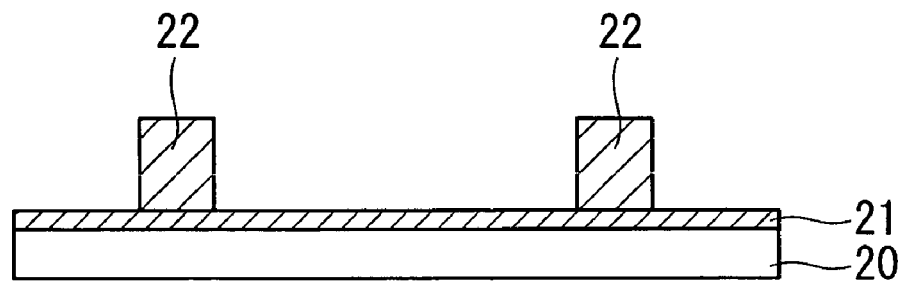
FIGS. 3A to 3C are process drawings for explaining a method of forming a multilayer interconnection structure according to a second embodiment of the present invention.

In the present embodiment, firstly as shown in FIG. 3A, a wiring layer 21 is formed on the surface of a substrate 10 made of glass or plastic, using a well-known method. On the wiring layer 21, mask pillars (mask material) 22 are formed in positions for forming openings H4 and H5 described later. The mask pillars 22 are formed by selectively applying liquid organic material such as a resist or the like and solidifying this using a quantitative discharge device. At this time, the film thickness (height) of the mask pillars 22 is assumed to be the same as, or more than that of an interlayer insulating film 23 described later. As a result, the mask pillars 22 can be prevented from being buried into the interlayer insulating film 23. In this step, in order to prevent the dropped liquid material from spreading excessively past the positions scheduled for forming the openings to the surroundings, it is desirable, before dropping, to previously perform a liquid-repelling treatment to the surroundings of the positions for forming the openings H4 and H5 in the wiring layer 21. The liquid-repelling treatment can be performed by forming a liquid-repelling film such as fluororesin for example, on the wiring layer.

Figure 3B:
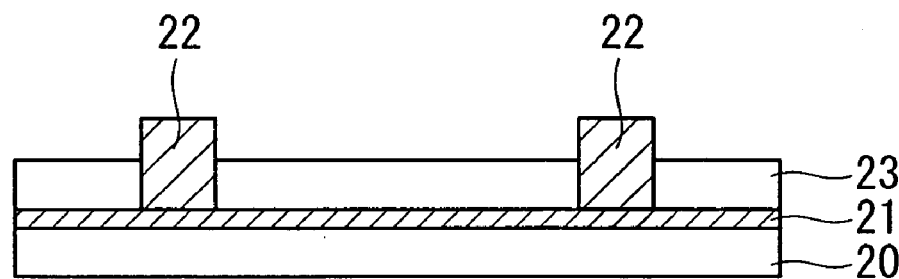

Next, as shown in FIG. 3B, an interlayer insulating film 23 made of oxide silicon or the like is formed in the surroundings of the mask pillars 22, that is, the whole surface of the substrate excluding the mask pillars 22. The interlayer insulating film 23 can be formed by applying liquid insulating material such as SOG, polysilazane, polyimide, Low-K material on the whole surface of the substrate using a method such as spin coating, and by heat treating the liquid insulating material. At this time, in order to prevent the liquid insulating material from adhering to the top of the mask pillars 22, it is desirable to previously perform a liquid-repelling treatment on the mask pillars 22 before applying the liquid insulating material. If the mask pillars 22 are formed by a liquid-repelling photoresist containing fluorine, such liquid-repelling treatment is unnecessary.

Figure 3C:
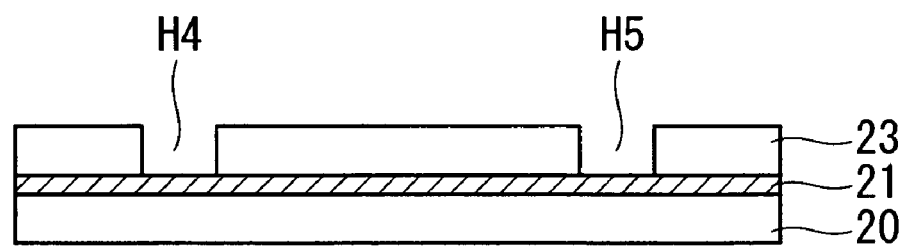

Next, as shown in FIG. 3C, the mask pillars 22 are removed using stripper or the like. Therefore, the openings H4 and H5 leading to the wiring layer 21 are formed in the interlayer insulating film 23.

Figure 4A:
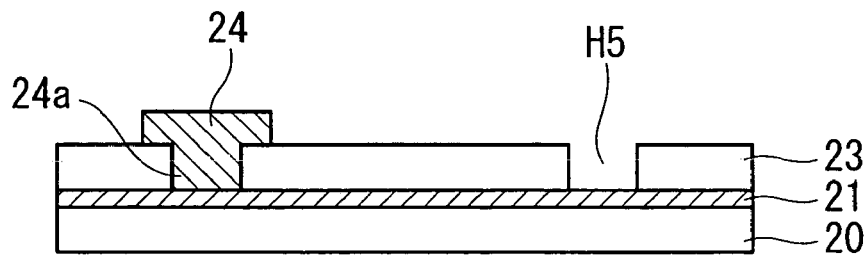
FIGS. 4A to 4D are process drawings following from FIGS. 3A to 3C.

Next, as shown in FIG. 4A, a wiring layer 24 communicating with the wiring layer 21 is formed over the interlayer insulating film 23 via the opening H4. In this step, firstly, using a quantitative discharge device, liquid contact forming material containing organometallic compounds as a main material is supplied in the opening H4, and this liquid contact forming material is baked and solidified, so that a connection plug 24a is formed in the opening H4. At this time, in order to reliably fill the liquid material inside of the opening H4, it is desirable to previously perform a lyophilic treatment inside of the opening.

Next, a liquid-repelling film is formed to cover the interlayer insulating film 23, and a ditch for wiring is formed in the liquid-repelling film by mask exposure. Then a liquid wiring material containing organometallic compounds as a main material is supplied in the ditch and heat treated in order to form the wiring layer 24. After that, the rest of the liquid-repelling film is decomposed and removed by irradiating ultraviolet rays on the whole substrate. The connection plug may be formed at the same time as the wiring layer 13.

Figure 4B:
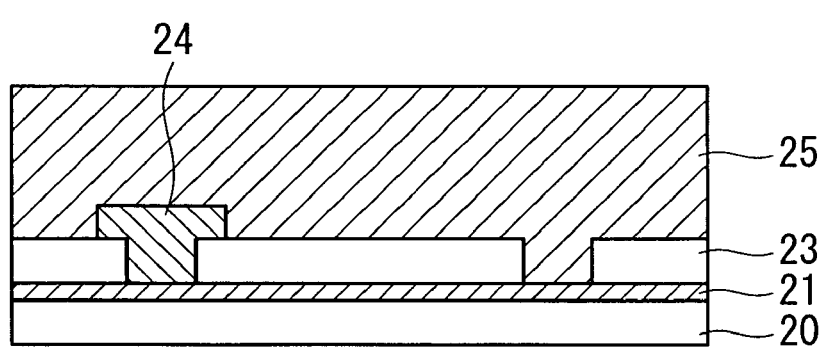

Next, as shown in FIG. 4B, using spin coating or the like, a resist 25, that is the photosensitive resin, is formed on the whole substrate to cover the wiring layer 24 and the interlayer insulating film 23. At this time, the film thickness of the resist 25 arranged over the interlayer insulating film 23 is assumed to be the same as, or more than that of an interlayer insulating film 26 described later. As a result, mask pillars 25 described later can be prevented from being buried into the interlayer insulating film 26.

Figure 4C:
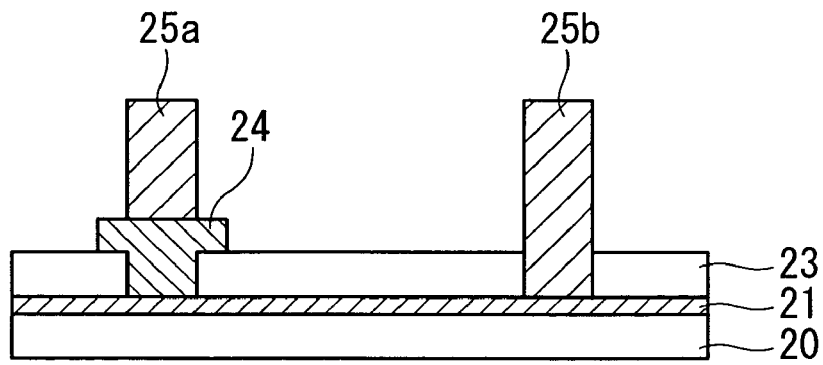

Next, as shown in FIG. 4C, the resist 25 is exposed and developed in order to leave the resist only in the forming position of the openings H4 and H5. As a result, a column shaped mask pillar 25a is formed in the forming position of the wiring layer 24, and a column shaped mask pillar 25b which covers the inside of the opening H5 and is extruded over the interlayer insulating film 23 is formed in the forming position of the opening H5 on the substrate.

Figure 4D:
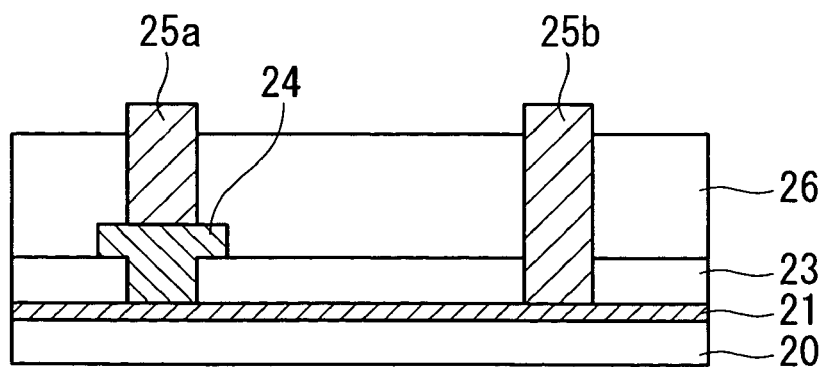

Next, as shown in FIG. 4D, the interlayer insulating film 26 made of oxide silicon or the like is formed in the surroundings of the mask pillars 25a and 25b, that is, the whole surface of the substrate excluding the mask pillars 25a and 25b. Similarly to the interlayer insulating film 23, the interlayer insulating film 26 can be formed by applying liquid insulating material using a method such as spin coating and by heat treating the liquid insulating material. At this time, in order to prevent the liquid insulating material from adhering to the top of the mask pillars 25a and 25b, it is desirable to previously perform a liquid-repelling treatment on the mask pillars 25a and 25b before applying the liquid insulating material. If the mask pillars 25a and 25b are formed by a liquid-repelling photoresist containing fluorine, such liquid-repelling treatment is unnecessary.

Figure 5A:
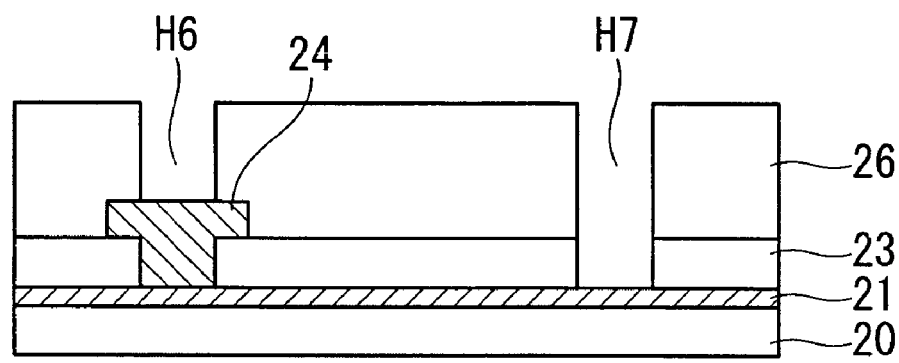
FIGS. 5A and 5B are process drawings following from FIGS. 4A to 4D.

Next, as shown in FIG. 5A, the mask pillars 25a and 25b are removed using a stripper or the like. Therefore, an opening H6 leading to the wiring layer 24 is formed in the forming position of the opening H4 in the interlayer insulating film 26. On the other hand, an opening H7 leading to the wiring layer 21 is formed in the forming position of the opening H5 in the interlayer insulating films 23 and 26.

Figure 5B:
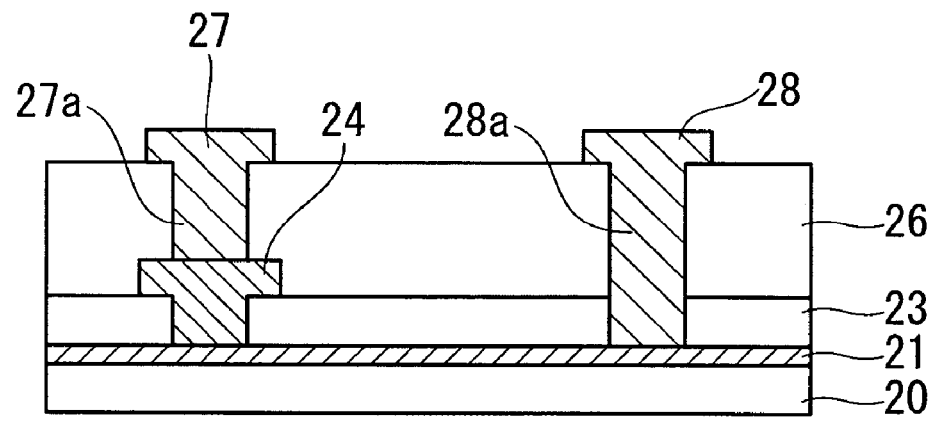

Next, as shown in FIG. 5B, a wiring layer 27 communicating with the wiring layer 24 is formed over the interlayer insulating film 26 via the opening H6, and a wiring layer 28 communicating with the wiring layer 21 is formed over the interlayer insulating film 26 via the opening H7. In this step, similarly to the forming step of the wiring layer 24 described above, firstly, using a quantitative discharge device, liquid contact forming material containing organometallic compounds as a main material is supplied in the opening H6, and this liquid contact forming material is baked and solidified, so that a connection plug 27a is formed in the opening H3. Subsequently, a liquid-repelling film is formed to cover the interlayer insulating film 26, and a ditch for wiring is formed in the liquid-repelling film by mask exposure. Then a liquid wiring material containing organometallic compounds as a main material is supplied in the ditch and heat treated in order to form the wiring layer 27. After that, the rest of the liquid-repelling film is decomposed and removed by irradiating ultraviolet rays on the whole substrate.

Next, a liquid contact forming material containing organometallic compounds as a main material is supplied in the opening H7, and this liquid contact forming material is baked and solidified, so that a connection plug 28a is formed in the opening H7. Subsequently, a liquid-repelling film is formed to cover the interlayer insulating film 26, and a ditch for wiring is formed in the liquid-repelling film by mask exposure. Then a liquid wiring material containing organometallic compounds as a main material is supplied in the ditch and heat treated in order to form the wiring layer 28. After that, the rest of the liquid-repelling film is decomposed and removed by irradiating ultraviolet rays on the whole substrate. The connection plugs 27a and 28a may be formed at the same time as the wiring layers 27 and 28. Moreover, either of the wiring layers 27 or 28 may be formed first.

In this way, in the present invention, contact holes between wiring layers can be formed without using dry etching, so that the connection reliability of the wiring can be increased.

(Third Embodiment)

Next is a description of a manufacturing method for multilayer wiring boards according to a third embodiment of the present invention, with reference to FIG. 6A to FIG. 8B. FIG. 6A to FIG. 7C show examples where the present invention is applied to a step of laminating three wiring layers on a substrate. In the present embodiment, the description is related to a method of forming a multilayer interconnection structure where a first layer and a third layer become conductive, and the first layer and a second layer become conductive.

Figure 6A:
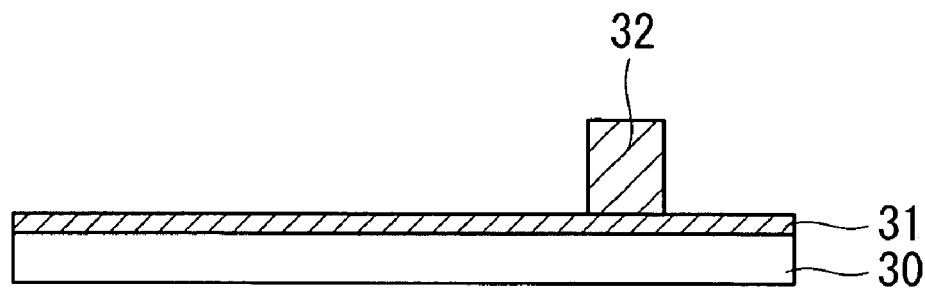
FIGS. 6A to 6C are process drawings for explaining a method of forming a multilayer interconnection structure according to a third embodiment of the present invention.

In the present embodiment, firstly as shown in FIG. 6A, a wiring layer 31 is formed on the surface of a substrate 30 made of glass or plastic, using a well-known method. On the wiring layer 31, a mask pillar (mask material) 32 is formed in the position for forming an opening H8 described later. The mask pillar 32 is formed by selectively applying liquid organic material such as a resist or the like and solidifying this by a quantitative discharge device. At this time, the film thickness (height) of the mask pillar 32 is assumed to be the same as, or more than that of an interlayer insulating film 33 described later. As a result, the mask pillar 32 can be prevented from being buried into the interlayer insulating film 33. In this step, in order to prevent the dropped liquid material from spreading excessively past the position scheduled for forming the opening to the surroundings, it is desirable before dropping, to previously perform a liquid-repelling treatment to the surroundings of the position for forming the opening H8 in the wiring layer 31. The liquid-repelling treatment can be performed by forming a liquid-repelling film such as fluororesin for example, on the wiring layer.

Figure 6B:
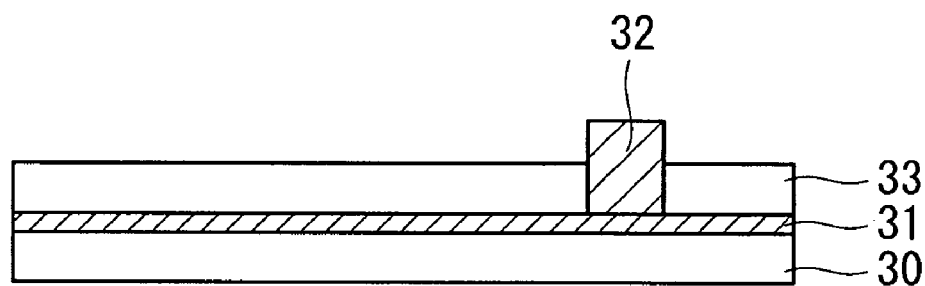

Next, as shown in FIG. 6B, an interlayer insulating film 33 made of oxide silicon or the like is formed in the surroundings of the mask pillar 32, that is, the whole surface of the substrate excluding the mask pillar 32. The interlayer insulating film 33 can be formed by applying liquid insulating material such as SOG, polysilazane, polyimide, low-K material on the whole surface of the substrate using a method such as spin coating, and by heat treating the liquid insulating material. At this time, in order to prevent the liquid insulating material from adhering to the top of the mask pillar 32, it is desirable to previously perform a liquid-repelling treatment on the mask pillar 32 before applying the liquid insulating material. If the mask pillar 32 is formed by a liquid-repelling photoresist containing fluorine, such liquid-repelling treatment is unnecessary.

Figure 6C:
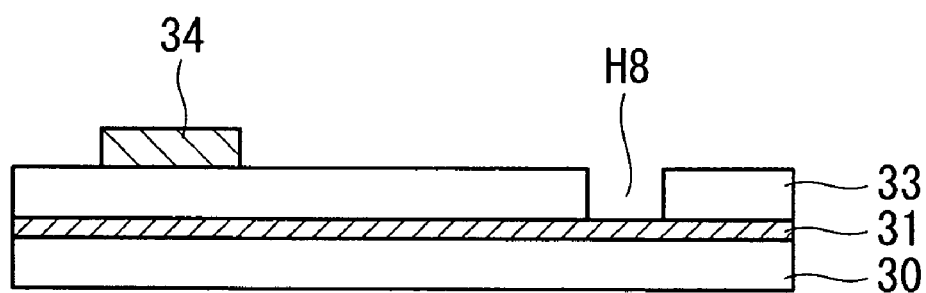

Next, as shown in FIG. 6C, a wiring layer 34 is formed over the interlayer insulating film 33. In this step, firstly, a liquid-repelling film is formed to cover the interlayer insulating film 33, and a ditch for wiring is formed in the liquid-repelling film by mask exposure. Then a liquid wiring material containing organometallic compounds as a main material is supplied in the ditch and heat treated in order to form the wiring layer 34. After that, the rest of the liquid-repelling film is decomposed and removed by irradiating ultraviolet rays on the whole substrate.

Next, the mask pillar 32 is removed using a stripper or the like. As a result, an opening H8 leading to the wiring layer 31 is formed in the interlayer insulating film 33. Either of the step of forming the wiring layer 34 or the step of removing the mask pillar 32 may be performed first.

Figure 7A:
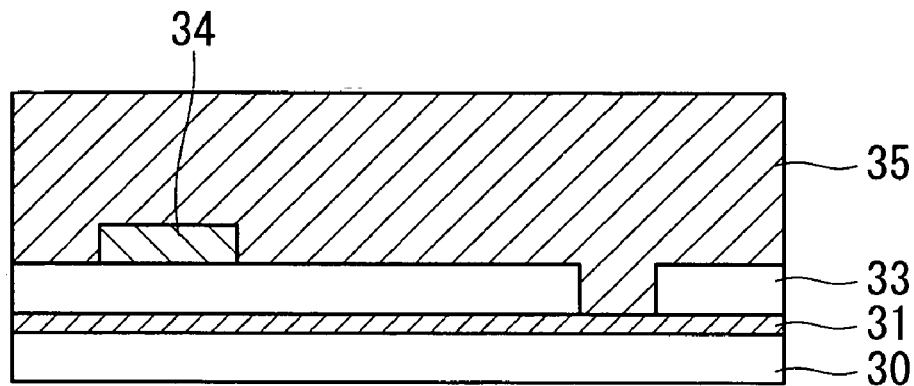
FIGS. 7A to 7C are process drawings following from FIGS. 6A to 6C.

Next, as shown in FIG. 7A, using spin coating or the like, a resist 35, that is, the photosensitive resin, is formed on the whole substrate to cover the wiring layer 34 and the interlayer insulating film 33. At this time, the film thickness of the resist 35 arranged over the interlayer insulating film 33 is assumed to be the same as, or more than that of an interlayer insulating film 36 described later. As a result, mask pillars 35 described later can be prevented from being buried into the interlayer insulating film 36.

Figure 7B:
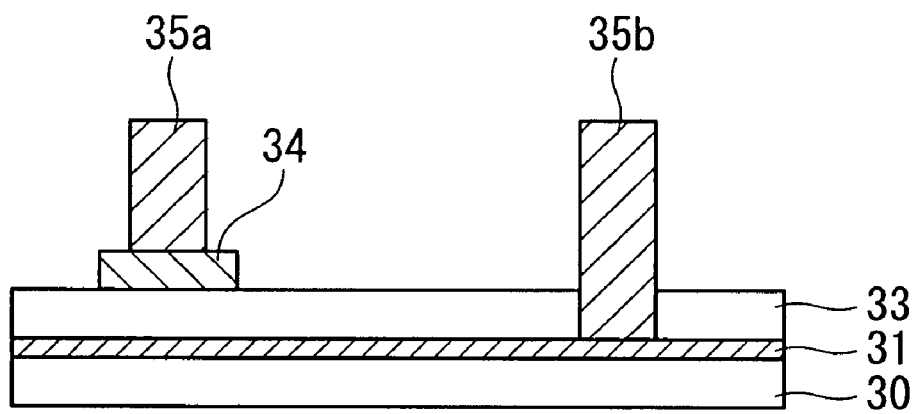

Next, as shown in FIG. 7B, the resist 35 is exposed and developed in order to leave the resist only in the forming position of the wiring layer 34 and the forming position of the opening H8. As a result, a column shaped mask pillar 35a is formed in the forming position of the wiring layer 34, and a column shaped mask pillar 35b which covers the inside of the opening H8 and is extruded over the interlayer insulating film 33 is formed in the forming position of the opening H8 on the substrate.

Figure 7C:
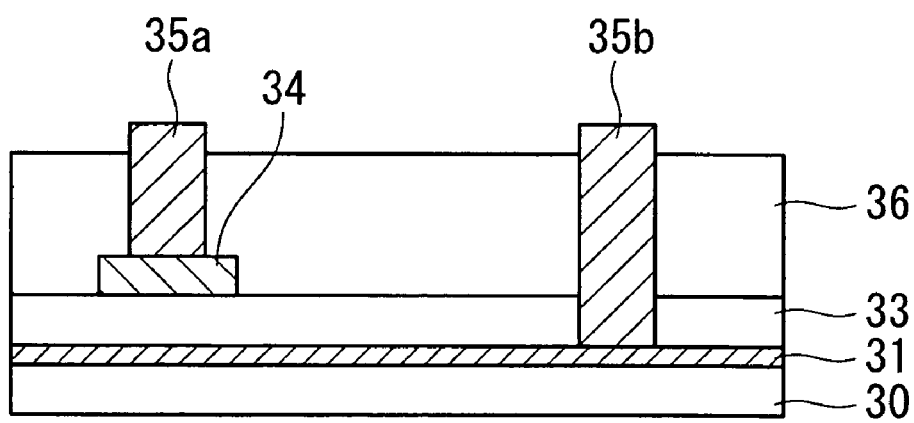

Next, as shown in FIG. 7C, the interlayer insulating film 36 made of oxide silicon or the like is formed in the surroundings of the mask pillars 35a and 35b, that is, the whole surface of the substrate excluding the mask pillars 35a and 35b. Similarly to the interlayer insulating film 33, the interlayer insulating film 36 can be formed by applying liquid insulating material using a method such as spin coating and by heat treating the liquid insulating material. At this time, in order to prevent the liquid insulating material from adhering to the top of the mask pillars 35a and 35b, it is desirable to previously perform a liquid-repelling treatment on the mask pillars 35a and 35b before applying the liquid insulating material. If the mask pillars 35a and 35b are formed by a liquid-repelling photoresist containing fluorine, such liquid-repelling treatment is unnecessary.

Figure 8A:
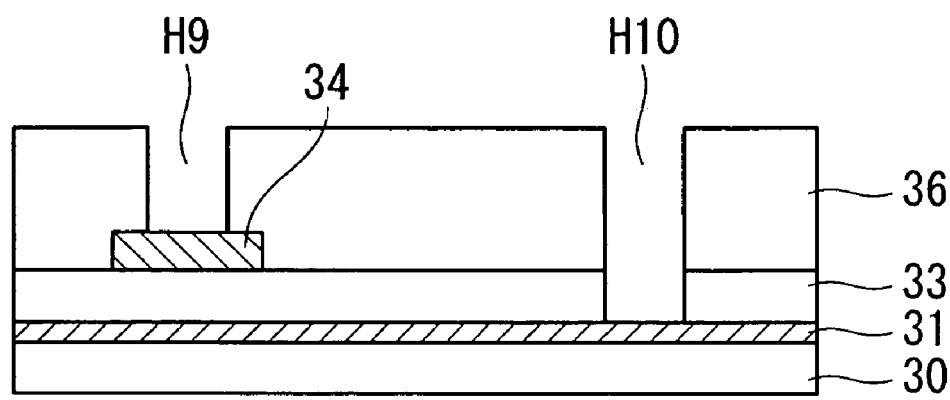
FIGS. 8A and 8B are process drawings following from FIGS. 7A to 7C.

Next, as shown in FIG. 8A, the mask pillars 35a and 35b are removed using a stripper or the like. Therefore, an opening H9 leading to the wiring layer 34 is formed in the forming position of the wiring layer 34 in the interlayer insulating film 36. On the other hand, an opening H10 leading to the wiring layer 31 is formed in the forming position of the opening H8 in the interlayer insulating films 33 and 36.

Figure 8B:
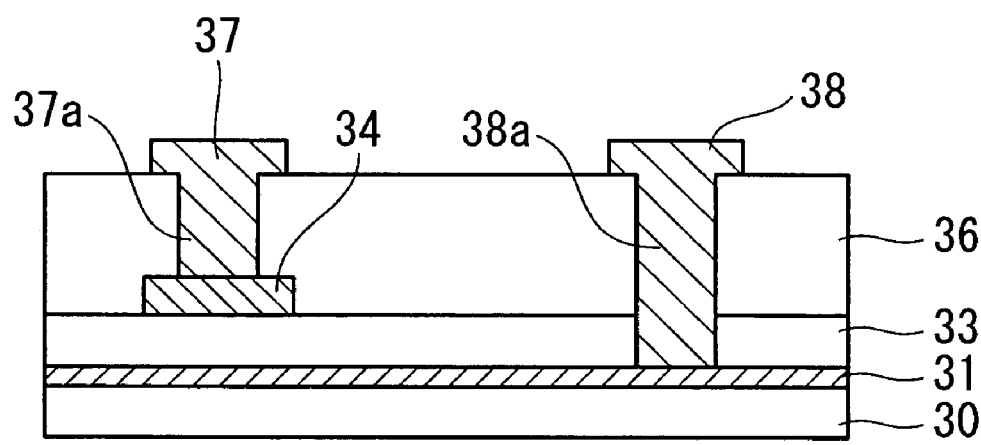

Next, as shown in FIG. 8B, a wiring layer 37 communicating with the wiring layer 34 is formed over the interlayer insulating film 36 via the opening H9, and a wiring layer 38 communicating with the wiring layer 31 is formed over the interlayer insulating film 36 via the opening H10. In this step, firstly, using a quantitative discharge device, liquid contact forming material containing organometallic compounds as a main material is supplied in the opening H9, and this liquid contact forming material is baked and solidified, so that a connection plug 37a is formed in the opening H9. Subsequently, a liquid-repelling film is formed to cover the interlayer insulating film 36, and a ditch for wiring is formed in the liquid-repelling film by mask exposure. Then a liquid wiring material containing organometallic compounds as a main material is supplied in the ditch and heat treated in order to form the wiring layer 37. After that, the rest of the liquid-repelling film is decomposed and removed by irradiating ultraviolet rays on the whole substrate.

Next, a liquid contact forming material containing organometallic compounds as a main material is supplied in the opening H10, and this liquid contact forming material is baked and solidified, so that a connection plug 38a is formed in the opening H10. Subsequently, a liquid-repelling film is formed to cover the interlayer insulating film 36, and a ditch for wiring is formed in the liquid-repelling film by mask exposure. Then a liquid wiring material containing organometallic compounds as a main material is supplied in the ditch and heat treated in order to form the wiring layer 38. After that, the rest of the liquid-repelling film is decomposed and removed by irradiating ultraviolet rays on the whole substrate. The connection plugs 37a and 38a may be formed at the same time as the wiring layers 37 and 38. Moreover, either of the wiring layers 37 or 38 may be formed formerly.

In this way, in the present invention, openings between wiring layers can be formed without using dry etching, so that the connection reliability of the wiring can be increased.

The present invention is not limited to the embodiments described above, and various modifications can be applied within a scope which does not depart from the gist of the claims.

For example, in the embodiments described above, the explanation gave an example of a method of forming a multilayer interconnection structure where three wiring layers were laminated via interlayer insulating films. However, a similar method can be used also in the case of forming a multilayer interconnection structure having four or more layers. In such a multilayer interconnection structure, as the gap between the wiring layers to be connected increases, for example, as the number of wiring layers arranged between the wiring layers to be connected increases, the effect of the present invention increases.

Moreover, in the aforementioned embodiments, the mask pillars were formed by a droplet discharge method and spin coating. However, any method can be freely selected. For example, the mask pillar 14a and mask pillars 25a and 25b may be formed by the droplet discharge method. However, with the droplet discharge method it is difficult to form a column shaped structure having a high aspect ratio. Therefore, it is preferable to select an application method according to the depth of the contact hole to be formed. Specifically, to form the photosensitive resin on the whole surface of the substrate, then in the case where the contact hole to be formed is shallow (for example, in the case where there is one interlayer insulating film layer penetrated by an opening), the droplet discharge method may be used, and in the case where the contact hole to be formed is deep (for example, in the case where there are a plurality of interlayer insulating film layers penetrated by an opening), the spin coating method or the like may be used. Then this may be patterned by exposure and development to form the mask pillar. When the droplet discharge method is used, the liquid organic material to be discharged need not be limited to photosensitive resin, and may be a polymide solution for example.

What is claimed is:

1. A method of forming a multilayer interconnection structure, the method comprising:
   forming a wiring over a substrate;
   forming a first region and a second region on the wiring, the second region being surrounded by the first region;
   applying a liquid material to the second region to form a mask material on the wiring, a liquid-repellent property of the first region against the liquid material being larger than a liquid-repellent property of the second region against the liquid material;
   forming an insulating film over the substrate, the insulating film surrounding the mask material, the insulating film not covering the mask material; and
   removing the mask material to form a hole in the insulating film.

2. The method of forming a multilayer interconnection structure according to claim 1, the liquid material being discharged as a droplet from a droplet-ejecting device.

3. The method of forming a multilayer interconnection structure according to claim 1, the liquid material including an organic material.

4. The method of forming a multilayer interconnection structure according to claim 1, the mask material being formed by irradiating the liquid material with an ultraviolet ray.

5. The method of forming a multilayer interconnection structure according to claim 1, the process of forming an insulating film including applying an insulating liquid material to the substrate.

6. The method of forming a multilayer interconnection structure according to claim 5, further comprising:
   providing a liquid-repellent treatment with the mask material against the insulating liquid material before the process of forming an insulating film.

7. The method of forming a multilayer interconnection structure according to claim 1, the substrate including a first conductive film, the mask material being formed on the first conductive film.

8. The method of forming a multilayer interconnection structure according to claim 7, further comprising:
   forming a second conductive film over the insulating film after the process of removing the mask material.

9. The method of forming a multilayer interconnection structure according to claim 1, the process of forming the first region including providing a liquid-repellent treatment to the wiring the change a liquid-repellent property of a portion of the wiring to form the first region, the liquid-repellent property not being provided to the second region.

* * * * *